(12) United States Patent
McClure et al.

(10) Patent No.: US 8,659,906 B2
(45) Date of Patent: Feb. 25, 2014

(54) PRINTED CIRCUIT BOARD

(75) Inventors: Stephen R. McClure, San Francisco, CA (US); Joshua D. Banko, Palo Alto, CA (US); John P. Ternus, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/442,801

(22) Filed: Apr. 9, 2012

(65) Prior Publication Data

US 2012/0195008 A1    Aug. 2, 2012

Related U.S. Application Data

(60) Continuation of application No. 13/117,016, filed on May 26, 2011, now Pat. No. 8,171,623, which is a division of application No. 12/694,166, filed on Jan. 26, 2010, now Pat. No. 7,995,334.

(60) Provisional application No. 61/292,739, filed on Jan. 6, 2010.

(51) Int. Cl.
  *H05K 1/00*    (2006.01)
(52) U.S. Cl.
  USPC ............................................ 361/749; 361/748
(58) Field of Classification Search
  USPC .................. 361/720, 726, 748, 760, 749; 174/260–262
  See application file for complete search history.

(56) References Cited

U.S. PATENT DOCUMENTS

| | | | |
|---|---|---|---|
| 4,490,690 A * | 12/1984 | Suzuki | 333/1 |
| 5,121,297 A * | 6/1992 | Haas | 361/751 |
| 5,248,960 A | 9/1993 | Hamma | |
| 5,266,746 A | 11/1993 | Nishihara et al. | |
| 6,211,936 B1 * | 4/2001 | Nakamura | 349/152 |
| 6,356,313 B1 | 3/2002 | Champion et al. | |
| 6,431,882 B1 | 8/2002 | Noda et al. | |
| 6,771,490 B2 | 8/2004 | Peker et al. | |
| 6,996,424 B2 | 2/2006 | Ijas et al. | |

(Continued)

FOREIGN PATENT DOCUMENTS

| | | |
|---|---|---|
| CN | 1388705 | 1/2003 |
| CN | 1448834 | 10/2003 |

(Continued)

OTHER PUBLICATIONS

Evaluation Report for Utility Model ZL2010206886282 dated Apr. 1, 2012.

(Continued)

*Primary Examiner* — Hung S Bui
(74) *Attorney, Agent, or Firm* — Jennifer Luh

(57) ABSTRACT

A methodology for connecting device components with circuitry located at different levels and orientations relative to one another is described. First circuitry can be located on a multi-plane rigid circuit board where the multi-plane rigid circuit board can include at least one flexible member sharing a common substrate with the multi-plane rigid circuit board that extends from a body portion of the multi-plane rigid circuit board. The flexible member can include traces used to convey power and/or data and an interface coupled to the power and/or data traces. The flexible member can be deflected or twisted to connect first circuitry on the body portion of the multi-plane rigid circuit board to second circuitry associated with another device component.

21 Claims, 4 Drawing Sheets

(56) References Cited

U.S. PATENT DOCUMENTS

| | | | |
|---|---|---|---|
| 7,095,476 B2 * | 8/2006 | Lo et al. | 349/150 |
| 7,292,448 B2 * | 11/2007 | Urushibara et al. | 361/748 |
| 7,439,449 B1 * | 10/2008 | Kumar et al. | 174/254 |
| 7,479,345 B2 * | 1/2009 | Nakamura | 429/129 |
| 7,515,431 B1 | 4/2009 | Zadesky et al. | |
| 7,531,752 B2 * | 5/2009 | Hirakata | 174/254 |
| 2001/0015005 A1 | 8/2001 | Chung et al. | |
| 2002/0059712 A1 | 5/2002 | Chen | |
| 2003/0027589 A1 | 2/2003 | Wennemer et al. | |
| 2003/0061696 A1 | 4/2003 | Staiger | |
| 2003/0084859 A1 | 5/2003 | Glovatsky et al. | |
| 2003/0127245 A1 | 7/2003 | Kusaka | |
| 2005/0212991 A1 | 9/2005 | Sugawara | |
| 2005/0225449 A1 | 10/2005 | Blakeway | |
| 2005/0285991 A1 | 12/2005 | Yamazaki | |
| 2006/0042827 A1 | 3/2006 | Chou et al. | |
| 2006/0067066 A1 | 3/2006 | Meier et al. | |
| 2006/0120035 A1 | 6/2006 | Merz et al. | |
| 2006/0193109 A1 | 8/2006 | Bander et al. | |
| 2006/0285302 A1 | 12/2006 | Kim | |
| 2007/0111598 A1 | 5/2007 | Quilici | |
| 2007/0121026 A1 | 5/2007 | Chang et al. | |
| 2007/0229475 A1 | 10/2007 | Gettemy et al. | |
| 2007/0254502 A1 | 11/2007 | Horikiri | |
| 2008/0055828 A1 | 3/2008 | Yang | |
| 2008/0165485 A1 | 7/2008 | Zadesky et al. | |
| 2009/0067141 A1 | 3/2009 | Dabov et al. | |
| 2009/0126450 A1 | 5/2009 | Su | |
| 2009/0195974 A1 | 8/2009 | Rambosek et al. | |
| 2009/0257189 A1 | 10/2009 | Wang et al. | |
| 2009/0264160 A1 | 10/2009 | Mochizuki et al. | |
| 2010/0061040 A1 | 3/2010 | Dabov et al. | |
| 2010/0157522 A1 | 6/2010 | Refai-Ahmed | |
| 2010/0265179 A1 | 10/2010 | Ram | |
| 2011/0090627 A1 | 4/2011 | Raff et al. | |

FOREIGN PATENT DOCUMENTS

| | | |
|---|---|---|
| CN | 1482796 | 3/2004 |
| CN | 1989474 | 6/2007 |
| CN | 2938613 | 8/2007 |
| CN | 201181435 | 1/2009 |
| CN | 101458365 | 6/2009 |
| EP | 0 090 921 | 2/1983 |
| EP | 1501340 | 1/2005 |
| EP | 1 791 218 | 11/2006 |
| EP | 1 884 870 | 2/2008 |
| JP | 02-170494 | 7/1990 |
| JP | 06-112622 | 4/1994 |
| JP | 2001263316 | 9/2001 |
| JP | 2001284747 | 10/2001 |
| JP | 2003273476 | 9/2003 |
| JP | 2005032752 | 2/2005 |
| JP | 2006128429 | 5/2006 |
| JP | 2007067243 | 3/2007 |

OTHER PUBLICATIONS

Notification of the First Office Action for CN201010613188.9 dated May 2, 2012.
International Search Report dated Apr. 5, 2011 in PCT Application No. PCT/US2010/046857.
Written Opinion dated Apr. 5, 2011 in PCT Application No. PCT/US2010/046857.
International Search Report dated Feb. 7, 2011 in PCT Application No. PCT/US2010/046939.
Written Opinion dated Feb. 7, 2011 in PCT Application No. PCT/US2010/046939.
U.S. Appl. No. 12/694,085, filed Jan. 26, 2010.
U.S. Appl. No. 12/694,162, filed Jan. 26, 2010.
U.S. Appl. No. 12/694,200, filed Jan. 26, 2010.
U.S. Appl. No. 12/694,168, filed Jan. 26, 2010.
U.S. Appl. No. 12/694,166, filed Jan. 26, 2010.
Partial Search Report dated Dec. 14, 2010 in PCT Application No. PCT/US2010/046928.
Partial Search Report dated Dec. 1, 2010 in PCT Application No. PCT/US2010/046857.
International Search Report dated Dec. 3, 2010 in PCT Application No. PCT/US2010/047270.
Written Opinion dated Dec. 3, 2010 in PCT Application No. PCT/US2010/047270.
International Search Reported Dec. 23, 2010 in PCT Application No. PCT/US2010/047272.
Written Opinion dated Dec. 23, 2010 in PCT Application No. PCT/US2010/047272.
International Search Report dated Apr. 13, 2011 in PCT Application No. PCT/US2010/046928.
Written Opinion dated Apr. 13, 2011 in PCT Application No. PCT/US2010/046928.
"Design Guidelines for Flexible Circuits," Electronic Packaging & Production, No. 8, Aug. 1988, Newton Mass.
Partial Search Report dated Dec. 2, 2010 in PCT Application No. PCT/US2010/046939.
Notice of Allowance dated May 11, 2011 in U.S. Appl. No. 12/694,166.
Office Action dated Feb. 6, 2012 for U.S. Appl. No. 12/694,085.
Search Report dated Nov. 15, 2011 for Chinese Utility Model Patent No. ZL201020688636.7.
Notice of Allowance dated Mar. 2, 2012 for U.S. Appl. No. 12/694,162.
Office Action dated Oct. 24, 2011 for U.S. Appl. No. 13/117,016.
Notice of Allowance dated Jan. 11, 2012 for U.S. Appl. No. 13/117,016.
Written Opinion dated Feb. 2, 2012 in PCT Application No. PCT/US2010/046857.
Notice of Allowance dated Apr. 4, 2012 for U.S. Appl. No. 12/694,168.

* cited by examiner

149 ⤴

```
┌─────────────────────────────────────────────┐
│ DETERMINING BEND LINE LOCATIONS AND STRESS  │
│ DISTRIBUTIONS OF A FLEXIBLE MEMBER OF A FIRST│
│               CIRCUIT BOARD                 │
│                                         150 │
└─────────────────────────────────────────────┘
                     │
                     ▼
┌─────────────────────────────────────────────┐
│  DETERMINING TRACE LOCATIONS ON A MEMBER OF │
│       A FIRST PRINTED CIRCUIT BOARD         │
│                                         152 │
└─────────────────────────────────────────────┘
                     │
                     ▼
┌─────────────────────────────────────────────┐
│  SECURING THE FIRST PRINTED CIRCUIT BOARD   │
│           TO A SUPPORT STRUCTURE            │
│                                         154 │
└─────────────────────────────────────────────┘
                     │
                     ▼
┌─────────────────────────────────────────────┐
│  SECURING A FIRST STRESS ISOLATOR ACROSS    │
│   THE MEMBER PROXIMATE TO A FIRST BENDLINE  │
│                                         156 │
└─────────────────────────────────────────────┘
                     │
                     ▼
┌─────────────────────────────────────────────┐
│   DEFLECTING AND/OR TWISTING AN END OF THE  │
│ MEMBER TO ALIGN IT IN A PREFERRED ORIENTATION│
│                                         158 │
└─────────────────────────────────────────────┘
                     │
                     ▼
┌─────────────────────────────────────────────┐
│  SECURING A SECOND STRESS ISOLATOR ACROSS   │
│  THE MEMBER PROXIMATE TO A SECOND BEND LINE │
│   SUCH THAT A PORTION OF THE MEMBER IS      │
│ PROXIMATELY PARALLEL TO THE SECOND SURFACE  │
│   AND WHERE THE PORTION OF THE MEMBER       │
│  INCLUDES A FIRST CONNECTION INTERFACE  160 │
└─────────────────────────────────────────────┘
                     │
                     ▼
┌─────────────────────────────────────────────┐
│ COUPLING THE FIRST CONNECTION INTERFACE ON  │
│   THE PORTION OF THE MEMBER TO A SECOND     │
│  CONNECTION INTERFACE ON A SECOND PRINTED   │
│               CIRCUIT BOARD             162 │
└─────────────────────────────────────────────┘
```

Figure 4

PRINTED CIRCUIT BOARD

CROSS REFERENCE TO RELATED APPLICATIONS

This application is a continuation of and claims priority to U.S. application Ser. No. 13/117,016, entitled "A METHOD OF MANUFACTURING A PRINTED CIRCUIT BOARD" by McClure et al., filed on May 26, 2011 which is a divisional of and claims priority to U.S. application Ser. No. 12/694,166, entitled "PRINTED CIRCUIT BOARD" by McClure et al., filed on Jan. 26, 2010 and U.S. Pat. No. 7,995,334 issued on Aug. 9, 2011 which claims priority to U.S. Provisional Patent Application No. 61/292,739, entitled "HANDHELD COMPUTING DEVICE" by Ternus et al., filed Jan. 6, 2010, all of which are hereby incorporated by reference herein.

This patent application is related to and incorporates by reference in their entirety the following co-pending patent applications:
 (i) U.S. patent application Ser. No. 12/694,085, entitled "HANDHELD COMPUTING DEVICE" by Ternus et al., filed Jan. 26, 2010;
 (ii) U.S. patent application Ser. No. 12/694,162, entitled "ASSEMBLY OF A DISPLAY MODULE" by McClure et al., filed Jan. 26, 2010;
 (iii) U.S. patent application Ser. No. 12/694,200, entitled "COMPONENT ASSEMBLY" by McClure et al., filed Jan. 26, 2010;
 (iv) U.S. patent application Ser. No. 12/694,168, entitled "DISPLAY MODULE" by McClure et al., filed Jan. 26, 2010; and
 (v) U.S. patent application Ser. No. 12/694,083, entitled "EDGE BREAK DETAILS AND PROCESSING" by Sweet et al., filed Jan. 26, 2010, that is, in turn, a continuation in part of U.S. patent application Ser. No. 12/580,934, entitled "METHOD AND APPARATUS FOR POLISHING A CURVED EDGE" by Lancaster et al., filed Oct. 16, 2009, that takes priority under 35 U.S.C. §119(e) to U.S. Provisional Patent Application Ser. No. 61/249,200, entitled "COMPLEX GEOGRAPHICAL EDGE POLISHING" by Johannessen, filed Oct. 6, 2009.

BACKGROUND

1. Field of the Described Embodiments

The described embodiments relate generally to computing devices such as laptop computers, tablet computers, and the like. More particularly, circuit board connection schemes are described.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. The trend of smaller, lighter and powerful presents a continuing design challenge in the design of some components of the portable computing devices.

One design challenge associated with the portable computing device is the design of the enclosures used to house the various internal components. This design challenge generally arises from a number conflicting design goals that includes the desirability of making the enclosure lighter and thinner, the desirability of making the enclosure stronger, and making the enclosure more aesthetically pleasing. Within the enclosure, power and data connections need to be established between the various internal components with considerations of the packing efficiency and ease of assembly.

Typically, the portable computing device will have one or more enclosure components where each enclosure component has some external profile with a 'thickness' that is relatively constant. Various internal components can be distributed within the external profile of each of the enclosure components. To improve the packing efficiency, the internal components can be located at various heights within the thickness of each enclosure component. Numerous data and power connections can link the internal components. Since two internal components can be situated at different heights, the data and power connections are needed to traverse the height difference to link the two components.

A connection between two internal components of different heights is often accomplished using a flexible cable often referred to as "flex." As an example, flex can be used to connect two circuit boards at different heights where each circuit board includes a connector that is compatible with connectors on each end of the flex. The use of flex requires extra connectors and more assembly steps, which increases costs. In view of the foregoing, there is a need for improved internal component connection schemes.

SUMMARY OF THE DESCRIBED EMBODIMENTS

This paper describes various embodiments that relate to systems, methods, and apparatus for enclosures for use in computing applications, such as the assembly of portable computing devices. A methodology for connecting device components with circuitry located at different levels and orientations relative to one another is described. In one embodiment, first circuitry can be located on a multi-plane rigid circuit board. The multi-plane rigid circuit board can include at least one flexible member. The flexible member can include traces used to convey power and/or data and an interface coupled to the power and/or data traces. The flexible member can be deflected or twisted to connect first circuitry on the multi-plane rigid circuit board to second circuitry associated with another device component. The flexible member can be formed as an integral component of the multi-plane rigid circuit board, i.e., the flexible member and the multi-plane rigid circuit and the flexible member share a common substrate.

In one aspect, a first printed circuit board and an enclosure for a portable computing device can be provided. The first printed circuit board can include a flexible member extending from a body portion of the first printed circuit board. The flexible member can includes a number of traces and a free end of the flexible member can include a first interface to the traces. The first printed circuit board can be secured within an interior portion of the enclosure. A first fastener can be secured across the flexible member such that a surface of the first fastener is in contact with a side of the flexible member including the traces. A portion of the fastener can be insulated to prevent shorts from occurring across the traces.

The free end of the flexible member can be deflected such that the flexible member is bent along a first line near the first fastener. The free end of the flexible member can be secured using a second fastener where the flexible member is bent along a second line near the second fastener. The first and second fasteners can tend to localize stresses resulting from deflecting and/or twisting the flexible members to an area on the flexible member between the two fasteners. After it is secured, the end portion of the free end can be located at a different depth within the enclosure than the body portion of the first printed circuit board and/or at a different angular orientation to the body portion. A second circuit board including second circuitry can be connected to the first interface to allow data and power to be transmitted between the second circuit circuitry and first circuitry located on the body portion of the first circuit board via the traces on the flexible member.

BRIEF DESCRIPTION OF THE DRAWINGS

The embodiments will be readily understood by the following detailed description in conjunction with the accompanying drawings, wherein like reference numerals designate like structural elements, and in which:

FIG. 4 is a flow chart of a method of manufacturing a portable computer device using a multi-plane rigid circuit board.

DESCRIBED EMBODIMENTS

Figure 1A:
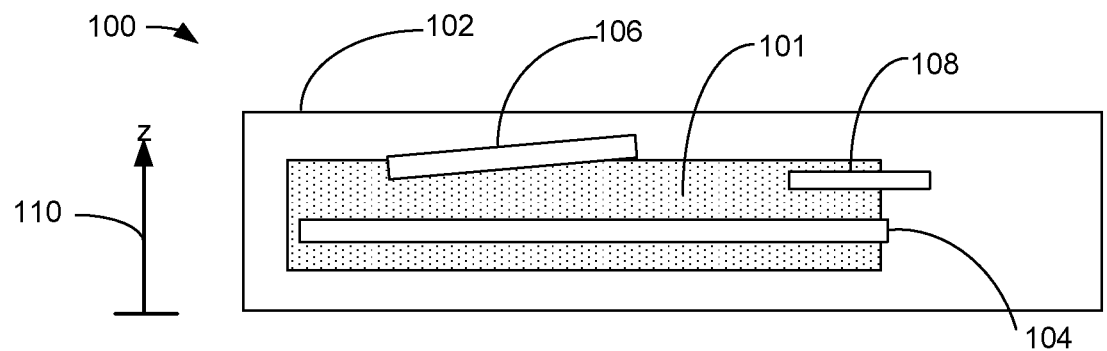
FIGS. 1a and 1b show a side view and a top view, respectively, of a portable computing device with three unconnected internal components in accordance with the described embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In particular embodiments of the devices described herein, one or more of internal components can include a multi-plane rigid circuit board. The multi-plane rigid circuit board can include at least one flexible member. The flexible member can include traces used to convey power and/or data and an interface coupled to the power and/or data traces. The multi-plane rigid circuit board can be installed within a computing device and then a free end of the flexible member can be deflected and/or twisted and secured at a location that is above or below a level where a remaining portion of the multi-plane rigid circuit board is secured or in a different plane from the remaining portion of the multi-plane rigid circuit board. The interface on the free end of the member can be coupled to a printed circuit board such that power and/or data can be transmitted between circuitry residing on the multi-plane rigid circuit board and circuitry residing on the printed circuit board via the flexible member. In some instances, the use of multi-plane circuit board can be used to replace flex cables in the design of the portable computing device.

As an example, a portable computing device can have a main logic board. The portable computing device can have an enclosure and the main logic board where the main logic board is designed to reside at a certain depth within the enclosure. The main logic board can be a multi-plane rigid circuit board. Thus, the main logic board can include one or more flexible members including power and/or data traces and an interface to the power and/or data traces. The main logic board can be installed at a first level within the portable computing device and then the one or more flexible members can be secured at locations above or below the level of the main logic board or in a different plane than the main logic board. The traces on the flexible member can be used to transmit power and/or data between the main logic board and another component associated with the portable computing device, such as but not limited to a SIM card, a wireless interface (e.g., an antenna), a multi-pin data connector, a multi-pin power connector or a combination multi-pin data and power connector.

The circuitry associated with the additional component can be located in a plane that is above or below a body portion of the main logic board and/or is not parallel to the main logic board. The flexible member on the main logic board can be used to traverse the depth change as well as an angle change between the body portion of the main logic board and a location of the circuitry associated with the additional component. In general, the methodology used herein can be used to connect two different circuitry components located in planes of a different depth where the planes can be at an angle relative to one another. The methodology can be applied within a computing device, portable or not, and is not limited to the example of a connection between a main logic board and other circuitry within a computing device.

Figure 1B:
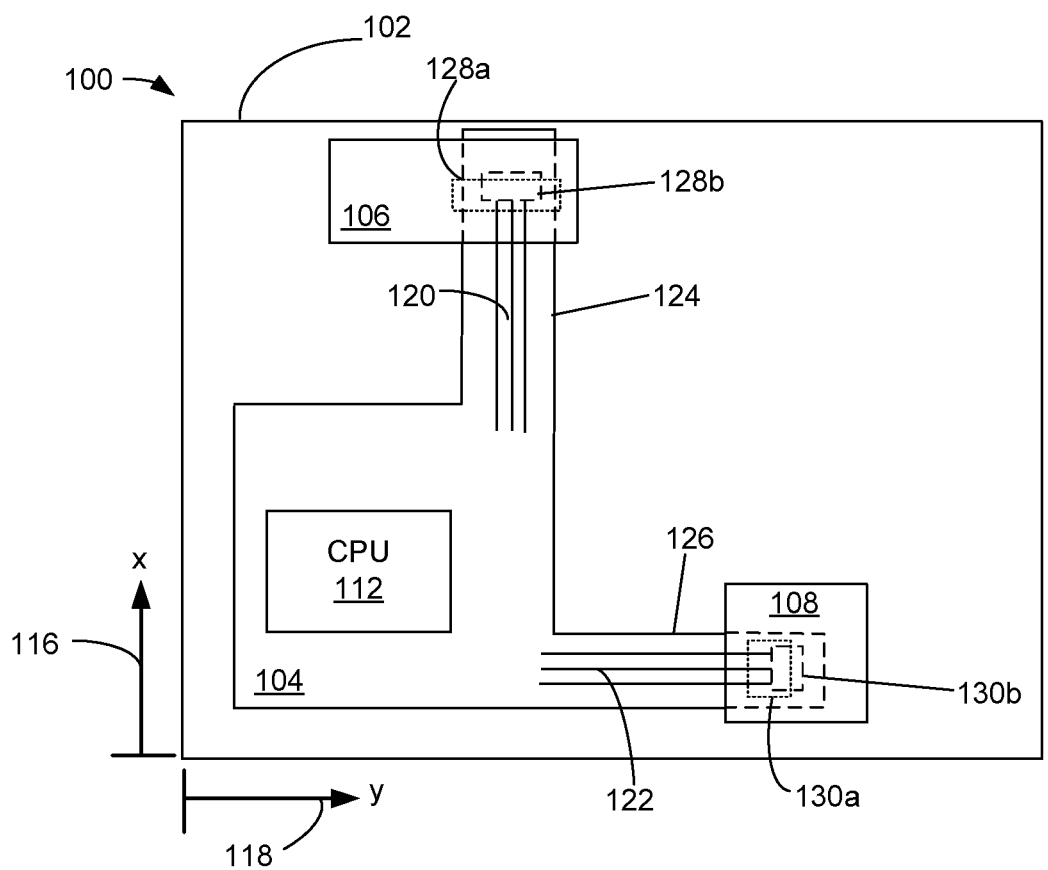
Figure 2A:
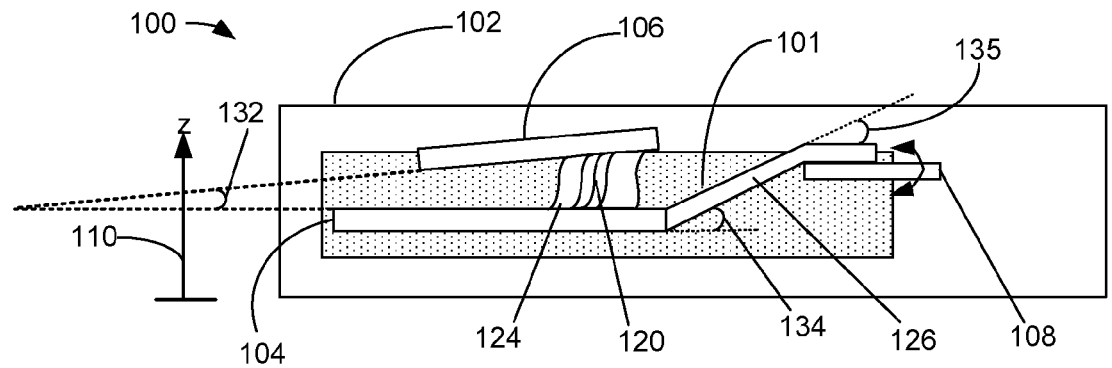
FIGS. 2a and 2b show a side view and a top view, respectively, of a portable computing device with three internal components shown in FIGS. 1a and 1b connected using a multi-plane rigid circuit board in accordance with the described embodiments.
Figure 2B:
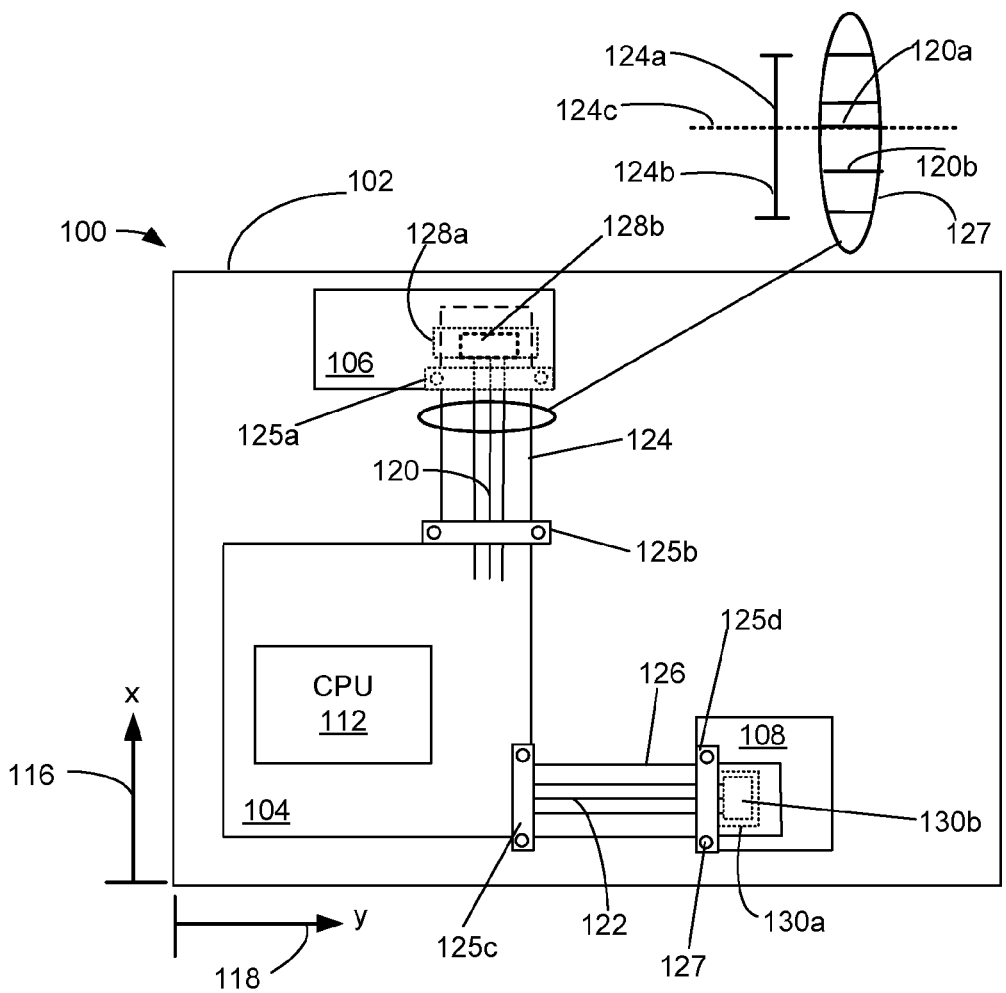
Figure 3:
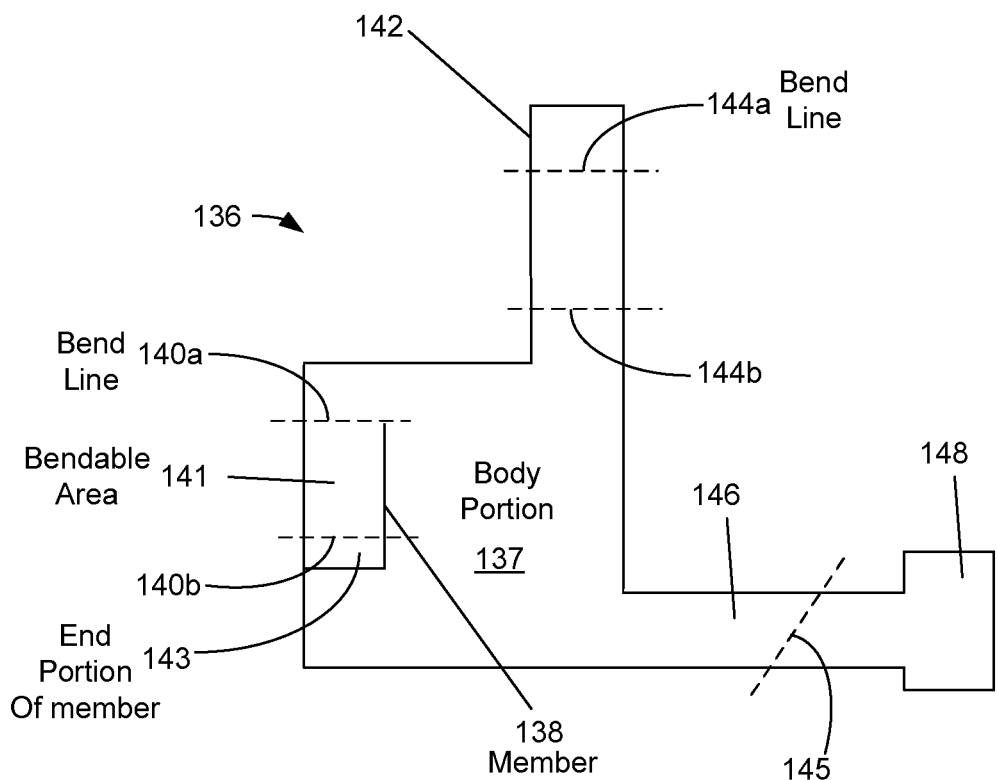
FIG. 3 shows a top view of a multi-plane rigid circuit board in accordance with the described embodiments.

The use of multi-plane rigid circuit boards is described with respect to the following FIGS. 1a-4. FIGS. 1a and 1b show a side view and a top view, respectively, of a computing device with three unconnected internal components where one of the components is a multi-plane rigid circuit board with two flexible members. FIGS. 2a and 2b show a side view and a top view, respectively, of a portable computing device with three internal components shown in FIGS. 1a and 1b connected using the two flexible members of the multi-plane rigid circuit board in accordance with the described embodiments. FIG. 3 shows a top view of a multi-plane rigid circuit board with three different flexible members. FIG. 4 is a flow chart of a method of manufacturing a portable computer device incorporating a multi-plane rigid circuit board.

FIGS. 1a and 1b show a side view and a top view, respectively, of a portable computing device 100 with three unconnected internal components in accordance with the described embodiments. The portable computing device 100 includes an enclosure 102. The external profile and the internal profile of the enclosure 102 is that of a rectangular box. The enclosure 102 can have a thickness, where different thickness heights are denoted by the 'z' dimension 110. A length and width of the enclosure 102 can be denoted by the x and y dimensions, 116 and 118, respectively.

The rectangular profile including its relative thickness is provided for illustrative purposes only. In various embodiments, the external profile can include various surfaces, such as rounded surfaces that differ from a pure rectangular profile. Further, the internal profile can be shaped very differently from the external profile. The internal profile can have steps and curved surfaces that vary from location to location throughout the interior of the computing device where a nominal thickness between the external and internal profiles can vary throughout the enclosure.

Various devices and their associated components can be distributed throughout the enclosure and linked together, such as but not limited to antenna components, external data and power interfaces, mechanical button components, audio components, display components, touch screen components, processor and memory components and battery components. Typically, devices and their associated components include printed circuit boards (PCBs) with associated connectors that allow the components to be linked to one another via a connection scheme of some type. The connection scheme can allow power to be delivered to a component, if required, and can allow for communication between various components to occur.

In FIGS. 1a and 1b, three PCBs, such as, 104, 106 and 108, are shown. The PCBs, 104, 106 and 108, are shown unconnected to one another. In one embodiment, PCB 104 is a main logic board and includes a CPU component 112. The PCBs, 104, 106 and 108, can be constructed from a material, such as a plastic, and other suitable materials useful with printed circuit boards.

In FIG. 1a, the PCBs, 104, 106 and 108 are located at different heights 110 within the enclosure 102. The first PCB 104 is located at a first height. The second PCB 106 and third PCB 108 are located at height above the first PCB 104. Further, the height of PCB 106 changes along the y dimension 118 while the heights of PCB 104 and PCB 108 are constant in this direction, i.e., the boards lie on a constant z-plane.

Each of the PCBs, 104, 106 and 108 can be secured or anchored to an underlying support structure that is coupled to the enclosure 102. The underlying support structure is generically illustrated as box 101. The support structure can include frames, fasteners and posts that can vary depending on the design of the portable computing device 100.

In FIG. 1b, prior to the connections being formed between the boards, the PCBs, 104, 106 and 108 can overlap with one another in the x, 116, and y, 118, dimensions. PCB 104 can include a center portion with two rectangular flexible members, 124 and 126, extending from the center portion of the PCB 104. Thus, in this example, PCB 104 can be multi-plane rigid circuit board. In the unconnected state, a portion of member 124 can be disposed below and can overlap with PCB 106 and a portion of member 126 can be disposed below and can overlap with PCB 108 as shown in the top view of FIG. 1b.

The flexible members 124 and 126 can be made of the same material as the remaining portion of the multi-plane rigid circuit board 104 where board 104 can be a single integral piece including integral traces, i.e., the members 124 and 126 are not formed separately and then coupled to the board 104. In some embodiments, the material composition used in 104 can be adjusted to make the entire board 104 and hence the flexible members 124 and 126 more flexible. In other embodiments, the material composition of the flexible members 124 and 126 and the area proximate to where the flexible members 124 and 126 extend from the board 104 can be adjusted to improve flexibility of the members and the board in these areas. Thus, portions of the board 104 can be more rigid than other portions of the board 104.

Member 124 includes an interface 128b to the power and/or data traces 120 that generally aligns with an interface 128a to circuitry on PCB 106. Member 126 includes an interface 130b to the power and data traces 122 that generally aligns with an interface 130b to circuitry on PCB 108. The interface pairs, (128a, 128b) and (130a, 130b) are shown slightly off-set from one another because they are unconnected. The deflection of the flexible members 124 and 126 in the z-dimension 110 to enable a connected state can shorten their length in the x, 116, and y, 118, dimensions respectively. When deflected, the interface pairs can be more closely aligned, i.e., less off-set in the x-y plane as is shown and described with respect to FIGS. 2a and 2b. Possible deflection distances in the z-dimension can be up to 15 mm or greater.

As described above, members, 124 and 126, of PCB 104 can include traces, 120 and 122, respectively. The traces form conductive paths on the PCB 104 and allow power and/or data to be transmitted between components on the PCB 104. The traces can be laid down when the over-all circuitry of PCB 104 is formed. Typically, the traces are a thin line of metal, such as copper. The thickness of each trace can vary from trace to trace. For instance, a trace that carries power can be thicker than a trace that carries data.

In general, one or more traces can be located on the members 124 and 126 and embodiments are not limited to the three traces shown in the Figures. Further, the number of traces can vary from member to member. For instance, member 124 can include traces that lead to a 30 pin connector and thus, can have 30 traces when all of the pins are connected. Member 126 can include traces that lead to a 10 pin connector and thus, can have 10 traces when all of the pins are connected. Seventy and one hundred pin connectors are available for certain devices and members 124 and 126 can be configured with the number of traces necessary to provide connections to these types of connectors. The number traces can vary according to the devices that are being connected, such as but not limited to a main logic board and a Sim card or an external data connector.

FIGS. 2a and 2b show a side view and a top view, respectively, of a portable computing device with three internal components shown in FIGS. 1a and 1b connected using the two flexible members, 124 and 126, of the multi-plane rigid circuit board in accordance with the described embodiments. Referring to FIG. 2b, in a connected state, an end of the member 124 is deflected in the z dimension 110 and twisted at an angle 132 such that the end of the member is secured in an orientation that is proximately parallel to a bottom surface of board 106. The amount of twist along the member 124 varies to allow it to reach angle 132 at its end. Thus, traces 120 on the member 124 are also bent and twisted through a range of angles until the angle 132 is reached.

The member 126 is bent at an angle 134 relative to the z-plane of the remaining portion of board 104. An end portion of member 126 is bent through a second angle 135 such that the end portion is parallel to a portion of the surface of board 108. Thus, the traces on 122 on member 126 are also bent through these two angles.

In this example, board 108 and the remaining portion of board 104 are proximately parallel. Thus, the angles 134 and 135 are proximately equal. In other embodiments, the angles 134 and 135 can be different. For instance, board 108 can be rotated up or down through an axis in the x dimension as indicated by the arrows in the FIG. 2a, such that angle 135 is greater than or less than angle 134 (depending on the direction and angle of rotation) to enable the end portion of member 126 to be parallel to a portion of surface 108.

Between the bend points at which angles 134 and 135 are shown, the member 126 is shown is being straight. This orientation is provided for illustrative purposes. Between the bend points, the member 126 can be bowed up or bowed down and possibly slightly twisted if board 104 and board 106 are not parallel to enable proper alignment of an interface on the member 126 and an interface on board 108. Thus, the orientation is not limited to being in a straight orientation as shown in the figure.

In a connected orientation, interface 128a is on a lower surface of board 106 and interface 128b is on a top surface of flexible member 124. In various embodiments, during assembly, a body portion of board 104 and the end of member 124 can be secured in their respective orientations. The body portion of board 104 can be secured first and then the end of member 124 can be secured or vice versa or both can be secured simultaneously. After the end of member 124 is secured (the remaining portion of board 104 may or may not be secured at this point), the board 106 can be secured such that a successful connection is made between the interfaces 128a and 128b. In another embodiment, the board 106 can be secured first and then the end of member 124 can be slid under board 106 to form a connection between the boards. After a connection is formed, the member 124 can be secured in place.

In another example, in a connected orientation, interface 130b is on an underside surface of the end of flexible member 126 and interface 130a is on a top surface of board 108. In various embodiments, during assembly, end portion of member 126 can be secured in place and then board 108 can be slid underneath to form a connection. Alternatively, board 108 can be secured in place and then the end portion of member 126 can be placed over the board 108, connected and then secured.

Referring to FIG. 2b, proximate to bend locations, fasteners can be used. For example, fasteners, 125a and 125b, are shown securing member 124 and fasteners 125c and 125d are shown securing member 126. The fasteners 125a-125d can include holes and posts, such as 127, for allowing a fastener, such as a screw, to be placed through the fastener. A portion of the fastener can be in contact with the traces, such as traces 120 and 122. When a portion of the fastener is in contact with the traces, it can be composed of a non-conductive material, such as plastic, to prevent shorts across the traces. A remaining portion of the fastener can be comprised of another material if desired, such as a metal. For instance a piece of metal with the mounting holes can be secured over a piece of plastic in contact with the traces.

The fasteners 125a and 125b can be placed in contact with the flexible members to define regions of bending on the flexible member 124. Similarly, fasteners 125a and 125b can be placed in contact with flexible member 126 to define region of bending. When the fasteners 125a and 125b or 125c and 125d are secured, most of the bending stress can be confined on the region of the flexible members, 124 or 126, between the fasteners such that stress is not transferred to the remaining portion of board 104 or to the areas where interfaces 128a/128b and 130a/130b are connected. Using fasteners in this way can prevent damage to board components, such as components on board 104 and prevent the connections between boards 104-106 and 104-108 from coming loose. Thus, the fasteners can be considered "stress isolators," in that the fasteners tend to localize or isolate the stress to particular areas, such as to a particular area of the flexible member.

In a particular embodiment, a surface of the portion the fasteners, such as 125a, 125b, 125c and 125d, can be rounded. The rounded surface can provide a radius of curvature for the bending of one of the members, such as 124 and 126, and prevent a sharp edge from pressing into the traces and possibly damaging the traces. Further, the radius of curvature can possibly reduce stresses on the traces that occur as result of bending. For example, an underside of fastener 125c can be rounded to provide a radius of curvature for the bending of member 126 through angle 134. The boards 108 can also be rounded for a similar purpose. For instance, an edge of board 108 can be rounded to provide a radius of curvature for the bending of the free end of member 126 through angle 135.

In particular embodiments, the traces on the flexible member can be organized in layers. For example, a number of trace layers, such as 10 trace layers, can be provided from near the top surface of flexible member 124 to a bottom surface of flexible member 124. One or more traces can be located in the in-depth layers. The trace layers can be populated when a multi-plane rigid circuit board, such as 104, is formed.

When the flexible member 124 is bent, a portion of the member 124 can be placed in compression and a portion can be placed in tension. For example, when member 126 is bent upwards near fastener 125c, a top portion of the member 126 is placed in compression and a lower portion of the member 126 is placed in tension. Within the member 126, such as near a center layer, the compressive and tensile forces are proximately balanced. In a bending beam, the layer where the forces are balanced is often referred to as the neutral axis. Similarly, in twisting, there can be regions that are compressed or stretched more than other areas and regions where forces are balanced. Areas where compressive and tensile forces are balanced or nearly balanced can be good locations to locate traces within a flexible member, such as members 124 and 126.

Referring to FIG. 2b, a side view across member 124 is shown to expose a number of layers between the top and bottom surface of member 124. A neutral axis 124c where compressive and tensile forces are proximately balanced is depicted. The neutral axis 124c is provided for the purposes of discussion only and is not meant to be an accurate representation of the location of the neutral axis.

On the portion of the secured members between the fasteners, such as between fasteners, 125a and 125b, on flexible member 124, more stress can be located near the top and bottom edge layers of the flexible member, such as in location 124b near the bottom surface, as compared to the center area 124a of the flexible member. The traces arranged on the member 124, such as traces 120a and 120b, can be of different thicknesses. For instance, a trace carrying power can be thicker than a trace carrying data. The thicker traces can tolerate more stress. During design of a multi-plane rigid circuit board, such as 104, the traces on the flexible members can be arranged such that thicker traces are located in regions anticipated to experience high stress and thinner traces can be located in regions anticipated to experience lower stresses as a result of bending. For example, the stresses on member 124 can be higher at the edge 124b than at the center 124a under bending. If trace 120a is thicker than 120b, trace 120a can be placed closer to the edge 124b than trace 120b.

The shape of a flexible member can be altered if it is does not have a big enough area of low stress to accommodate all of the traces that require a low stress level. For instance, if there were too many traces to fit in a center area 124a of member 124 that will experience low stress upon bending, then width of member 124 can be widened to increase an area of low stress near the center 124a. Then, additional traces can be routed through the low stress area. As another example, the thickness of the flexible member, such as 124 or 126, can be increased to possibly increase a number of suitable layers in the low stress areas.

As a result of variable bending and twisting along a length of a flexible member. The areas of low stress can vary along a length of the member. For example, as a result of twisting at one end of member 124 the area of low stress can be closer to a particular edge or surface than at the other end. The traces can be designed to follow a path of low stress along the member. Thus, traces do not necessarily have to follow a straight path parallel to the edge of the flexible member along the length of the member. For instance, the traces can follow a curved path along the length of a flexible member. In the design process, stress distributions for various deflections of a flexible member can be determined and these stress distributions can be used to develop trace paths along the flexible member.

In particular embodiments, because of the stress between the fasteners on a flexible member, it may be desirable not to place any circuitry components other than the traces in between the fasteners. In other embodiments, if the stress is not too great it can be possible to place additional circuitry components in this area. To allow the fasteners to apply a force evenly across the flexible members and because the region next to the fasteners experiences high bending stresses, it may be desirable not to locate circuitry other than traces proximate to where the fasteners are secured and particularly beneath the fasteners.

FIG. 3 shows a top view of a multi-plane rigid circuit board 136 in accordance with the described embodiments. The board 136 includes three flexible members, 138, 142 and 146. Two of the flexible members 142 and 146 extend from a body portion 137 of the board 136. A third member 138 is within the body portion 137. Each flexible member, such as 138, 142 and 146 can be associated with multiple bend lines and include an end portion located near the free end of the flexible member. Bend lines 140a and 140b are depicted for member 138 and bend lines 144a and 144b are depicted for member 142.

An end portion 143, below bend line 140b, on the free end of member 138 is shown. The end portion 143 can include an interface that connects to power and/or data traces located on the member 138. The free end of member 138 can be deflected up or down as well as twisted and secured at another location. Then, the interface on the free end can be coupled to other circuitry, such as another board, to establish power and data connections.

A bend line does not have to be necessary located at the intersection between the flexible member and the body portion 137. In various embodiments, the bend line can be located a distance away from the intersection. For example, bend line 144b is located on flexible member 142 above the intersection between the member 142 and the body portion 137.

Two bend lines are depicted for members 138 and 142. In one embodiment, a flexible member, such as 138, 142 or 146 can be bent along only a single bend line. In other embodiments, a flexible member can be bent at more than two locations along the member. The bend lines that are generally perpendicular to an edge of the flexible member are depicted. Nevertheless, in further embodiments, one or more diagonal bend lines, such as bend line 145 can be used. Finally, although flexible members have been shown as rectangles of a constant width other shapes are possible in various embodiments. For instance, member 146 includes a widened end portion 148 where the width of the portion 148 is wider than the rest of the body of the member 146. In other examples, the flexible members can have curved or tapered portions (not shown).

FIG. 4 is a flow chart of a method 149 of manufacturing a computer device, such as portable computing device, using a multi-plane rigid circuit board. In 150, the bend line locations and stress distributions across of a flexible member of a first circuit board can be determined. The first printed circuit board can be a multi-plane rigid circuit board as previously described. In one embodiment, the first printed circuit board can be a main logic board for the portable computing device. In 152, the trace locations on a flexible member of a first printed board can be determined. The trace locations can be arranged on the flexible member based upon the determined stress locations. For instance, thicker traces can be placed in high stress areas and thinner traces can be placed in low stress areas. If the low stress areas are not large enough to accommodate all of the thin trace lines then the flexible member can be resized and steps 150 and 152 can be repeated. Next, the first circuit board can be manufactured. In one embodiment, the first circuit board can include markings on the flexible member indicating proximate locations where bending is to take place on the flexible member during assembly.

In 154, the first printed circuit board can be secured to a support structure associated with an enclosure of the portable computing device. In 156, a first stress isolator, which can be a fastener, can be secured across a flexible member associated with the first printed circuit board proximate to a first bend line associated with the flexible member. In 158, a free end of the flexible member can be deflected and/or twisted such that an end portion of the flexible member is aligned in a preferred orientation. The preferred orientation of the flexible member can be at different level and/or in a different planar orientation than a portion of the first printed circuit board.

In 160, a second stress isolator, which can be a fastener, can be secured across the flexible member proximate to a second bend line to fix the end of the flexible member in the preferred orientation. If necessary, additional fasteners can be used to secure the end portion in the preferred orientation. In 162, a first connection interface on the end the portion of the member in the preferred orientation can be secured to a second connection interface on a second printed circuit board. Via traces on the flexible member, power and/or data can be transferred between the first circuit board and the second circuit board. In a particular embodiment, the first circuit board can be a main logic board and the second circuit board can be associated with one of a an external pin connector interface, a Sim Card, an antenna, a memory unit, a display, an audio device, a touch screen, a button or some other type of mechanical controller (e.g., a volume slider or volume disc).

The advantages of the invention are numerous. Different aspects, embodiments or implementations may yield one or more of the following advantages. The connection schemes described herein allows for a first circuit board with a flexible member. The flexible member can include traces for carrying power and/or data and an interface to the power and/or data traces. A flexible member can be deflected and secured at a first level within the portable computing device and a remaining portion of the first circuit board can be secured at a second level. Via the interface on the flexible member, a second circuit board secured at the first level can be coupled to the first circuit board. One advantage is that power and/or data connections between two circuit boards secured within a portable device at different levels can be linked without the use of flex. The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A printed circuit board comprising:
   a body portion of the printed circuit board;
   a flexible portion of the printed circuit board that extends from the body portion of the printed circuit board, comprising a plurality of traces; and
   an end portion of the printed circuit board including an interface to the plurality of traces, wherein the flexible portion is proximately located in a first plane at a first depth level within an enclosure, wherein the body portion of the printed circuit board is proximately located in a second plane at a second depth level within the enclosure, wherein the plurality of traces includes thicker traces and thinner traces and wherein the thicker traces are located in a first region of the flexible portion that is near a side edge of the flexible portion, wherein the thinner traces are located in a second region of the flexible portion that is farther from the side edge of the flexible portion than the first region, wherein the first region of the flexible portion is devoid of thinner traces and the second region of the flexible portion is devoid of thicker traces.

2. The printed circuit board as recited in claim 1, wherein the printed circuit board is secured by a first fastener placed across the printed circuit board proximate to where the flexible portion of the printed circuit board extends from the body portion of the printed circuit board and is secured by a second fastener placed across the printed circuit board proximate to an end of the flexible portion of the printed circuit board.

3. The printed circuit board of claim 2 wherein the first fastener includes a rounded surface configured to increase a bending radius of the printed circuit board proximate to the first fastener.

4. The printed circuit board of claim 3 wherein the first fastener and the second fastener are configured to concentrate bending stress in an area of the printed circuit board between the two fasteners.

5. A printed circuit board, comprising:
a body portion of the printed circuit board;
a flexible portion of the printed circuit board, comprising a plurality of traces and an end portion of the printed circuit board including an interface to the plurality of traces, wherein the flexible portion is proximately located in a first plane at a first depth level within an enclosure, wherein the body portion of the printed circuit board is proximately located in a second plane at a second depth level within the enclosure, wherein the plurality of traces includes thicker traces and thinner traces, wherein the thicker traces are located closer to a side edge of the flexible portion than the thinner traces; and
a second circuit board secured within the enclosure and couple to the interface on the end portion of the printed circuit board such that power and data are communicated between the second circuit board and a main logic board via the plurality of traces on the flexible portion of the printed circuit board.

6. The printed circuit board as recited in claim 5, wherein the second plane is rotated at an angle relative to the first plane.

7. The printed circuit board as recited in claim 6, wherein the printed circuit board and the main logic board share a common substrate.

8. A multi-plane printed circuit board for use in computing device, comprising:
an integrally formed portion, comprising a rigid body portion and a flexible portion integrally formed with the rigid body portion, wherein a free end of the flexible portion is arranged to be deflected and rotated as needed and secured at a location that is displaced in a different plane from the rigid body portion of the multi-plane rigid PCB; and
an interface at the free end of the flexible portion, the interface on the free end of the flexible portion suitable for being coupled to another printed circuit board in place of a flexible cable.

9. The multi-plane PCB as recited in claim 8, further comprising:
a plurality of traces organized in layers comprising a first layer of traces and a second layer of traces that experience stress concurrently.

10. The multi-plane PCB as recited in claim 9, wherein the first of traces in the flexible portion located at a bottom part of the flexible portion of the multi-plane PCB experiences a tensile force when the free end of the flexible portion is bent in an up-ward direction.

11. The multi-plane PCB as recited in claim 10, wherein the second layer of traces in the flexible portion located at a top part of the flexible portion of the multi-plane PCB experiences a compressive force when the free end of the flexible portion is bent in the up-ward direction.

12. The multi-plane PCB as recited in claim 11, wherein the compressive force at the top part of the upwardly bent multi-plane PCB and the tensile force at the bottom part of the upwardly bent PCB are balanced at a neutral axis of the multi-plane PCB.

13. The multi-planned PCB as recited in claim 12, wherein the location of the neutral axis of the multi-plane PCB is based upon a location, number, and thickness of the first and second plurality of traces.

14. The multi-plane PCB an recited in claim 13, wherein the plurality of traces in a high stress portion of the multi-plane PCB are thick traces.

15. The multi-plane PCB as recited in claim 13, wherein the plurality of traces in a low stress portion of the multi-plane PCB are thin traces.

16. The multi-plane PCB as recited in claim 8, further comprising:
a stress isolator, the stress isolator arranged to reduce an amount of stress in the multi-plane PCB.

17. The multi-plane PCB as recited in claim 16, wherein the stress isolator is configured as a fastener.

18. The multi-plane PCB as recited in claim wherein the flexible bed portion comprises a plurality of traces including thicker traces and thinner traces and wherein at least some of the thicker traces are routed across areas on the flexible portion with stress values that are higher than the stress values where at least some of the thinner traces are routed on the flexible portion.

19. A printed circuit board, comprising:
a flexible portion;
a plurality of thicker traces in the flexible portion, wherein at least some of the thicker traces are located in one or more first regions of the flexible portion; and
a plurality of thinner traces in the flexible portion, wherein at least some of the thinner traces are located in one or more second regions of the flexible portion, wherein the one or more first regions of the flexible portion experiences more stress than the one or more second regions of the flexible portion.

20. The printed circuit board defined in claim 19 wherein at least some of the thicker traces are located closer to a side edge of the flexible body portion than at least some of the thinner traces.

21. The printed circuit board defined in claim 19 wherein at least some of the thicker traces are routed across areas on the flexible portion with stress values that are higher than the stress values where at least some of the thinner traces are routed on the flexible portion.

* * * * *

UNITED STATES PATENT AND TRADEMARK OFFICE
CERTIFICATE OF CORRECTION

| | | |
|---|---|---|
| PATENT NO. | : 8,659,906 B2 | Page 1 of 1 |
| APPLICATION NO. | : 13/442801 | |
| DATED | : February 25, 2014 | |
| INVENTOR(S) | : Stephen R. McClure et al. | |

It is certified that error appears in the above-identified patent and that said Letters Patent is hereby corrected as shown below:

In the claims

In claim 5, column 11, line 37, delete "couple to the interface" and insert -- coupled to the interface --

In claim 8, column 11, line 48, delete "printed circuit board for use" and insert -- printed circuit board (PCB) for use --

In claim 18, column 12, line 35, delete "flexible bed portion" and insert -- flexible portion --

Signed and Sealed this
Twenty-first Day of October, 2014

Michelle K. Lee
*Deputy Director of the United States Patent and Trademark Office*